United States Patent
Guerrero Pérez

(10) Patent No.: US 11,709,003 B2
(45) Date of Patent: Jul. 25, 2023

(54) METHOD FOR OPTIMIZING POWER PRODUCTION IN PHOTOVOLTAIC MODULES

(71) Applicant: SOLTEC INNOVATIONS, S.L., Molina de Segura (ES)

(72) Inventor: Javier Guerrero Pérez, Lorca (ES)

(73) Assignee: SOLTEC INNOVATIONS, S.L., Molina de Segura (ES)

( * ) Notice: Subject to any disclaimer, the term of this patent is extended or adjusted under 35 U.S.C. 154(b) by 0 days.

(21) Appl. No.: 17/918,897

(22) PCT Filed: Mar. 18, 2021

(86) PCT No.: PCT/ES2021/070197
§ 371 (c)(1),
(2) Date: Oct. 13, 2022

(87) PCT Pub. No.: WO2021/209657
PCT Pub. Date: Oct. 21, 2021

(65) Prior Publication Data
US 2023/0124752 A1    Apr. 20, 2023

(30) Foreign Application Priority Data

Apr. 14, 2020 (EP) .................................... 20169483

(51) Int. Cl.
*F24S 50/20* (2018.01)
*F24S 50/60* (2018.01)
(Continued)

(52) U.S. Cl.
CPC ............ *F24S 50/20* (2018.05); *F24S 50/40* (2018.05); *F24S 50/60* (2018.05); *G05B 17/02* (2013.01)

(58) Field of Classification Search
CPC . F24S 50/20; F24S 50/40; F24S 50/60; G05B 17/02
See application file for complete search history.

(56) References Cited

U.S. PATENT DOCUMENTS

2013/0048049 A1    2/2013   Flanery
2021/0080980 A1*   3/2021   Kesler ................... H02S 20/32

OTHER PUBLICATIONS

International Search Report for related patent application PCT/ES2021/070197 issued by the European Patent Office dated Jul. 6, 2021, 3 pgs. in English.
(Continued)

*Primary Examiner* — Chad G Erdman
(74) *Attorney, Agent, or Firm* — Hassan Abbas Shakir; Shakir Law PLLC

(57) ABSTRACT

A method allows positioning the tracker at angles that promote the cooling of photovoltaic modules and therefore, decrease their operating temperature, without reducing the total energy produced thus optimizing power production of photovoltaic (PV) electricity by reducing the working temperature of PV modules of a solar tracker. The method also provides an optimization of the electrical output of the system for particular conditions of instantaneous air temperature and wind speed to improve electrical power generation ratios with respect to those known current techniques taking into account incident power in the PV plane, or in some cases the output power without considering the action of changes in wind speed or air temperature.

5 Claims, 3 Drawing Sheets

(51) Int. Cl.
*F24S 50/40* (2018.01)
*G05B 17/02* (2006.01)

(56) References Cited

OTHER PUBLICATIONS

Written Opinion of the International Search Authority for related patent application PCT/ES2021/070197 issued by the European Patent Office dated Jul. 6, 2021, 5 pgs. in English.

* cited by examiner

METHOD FOR OPTIMIZING POWER PRODUCTION IN PHOTOVOLTAIC MODULES

CROSS-REFERENCE TO RELATED APPLICATIONS

This application is a national stage under 35 U.S.C. § 371 of PCT patent application PCT/ES2021/070197 filed on 18 Mar. 2021, which is hereby incorporated by reference in its entirety for all purposes. PCT/ES2021/070197 claims priority to European Patent Application 20169483.3 filed on 14 Apr. 2020, which is hereby incorporated by reference in its entirety for all purposes.

TECHNICAL FIELD

It is desirable to develop fast and effective methods that may optimize the production of electrical power without particularly requiring the operating temperature of the module, avoiding trial and error processes currently known in the art to determine the optimum operating point. Besides, this should come along with an accurate estimation of the electrical power that a photovoltaic (PV) module must produce under real operating conditions, improving the identification of failures and improper operational modes of the system by comparison between estimated power and produced power.

BACKGROUND

Currently, the module temperature variable is not considered when positioning solar panels, in fact it is assumed to be constant when the angle of orientation of the panel changes. The investigations carried out indicate that the cooling of the tracker, and therefore the operating temperature of the module, does vary according to the angle of position of the tracker. These variations have an influence on the production and, therefore, the consideration of this variable in the positioning of the tracker can increase the electrical production of the module.

Known methodologies that optimize electrical power production are mainly based on measurements without previously estimating the module's operating temperature and are based on trial and error processes to determine the optimum operating point. In addition, it avoids the indeterminacy situation under new conditions, in which the algorithms based on measurements take unknown positions. In addition, the complete simulation of the plant considering the topography allows reaching a combination of tracker positions that enables the optimization of global energy generation, instead of independent optimization of trackers.

DESCRIPTION

The object of invention allows to position the tracker at angles that promote the cooling of the modules and therefore, decrease their operating temperature, without reducing the total energy produced thus optimizing power production of photovoltaic (PV) electricity by reducing the working temperature of PV modules of a solar tracker. This, as the skilled person would acknowledge, increases the power conversion ratio enhancing the electrical conversion efficiency of the module in operation and, therefore, increasing electrical power production. The object of invention does not only solve the problems known in the art, but also provides an optimization of the electrical output of the system for particular conditions of instantaneous air temperature and wind speed thus improving electrical power generation ratios with respect to those known current techniques taking into account incident power in the PV plane, or in some cases the output power without considering the action of changes in wind speed or air temperature.

The method of the invention is preferably implemented in the tracker control system. The control system processes the input data and determines the angle at which the solar trackers should be positioned. In this way, the photovoltaic modules are oriented in the plane indicated by the algorithm, in which the electrical production is optimized, considering both the power received in the form of irradiation and the operating conditions involved in the power conversion of the module.

The method of the invention achieves a reduction in the temperature of the PV modules compared to traditional methods that simply arrange the module to maximize power production in the form of radiation received in the plane of the module. The method of the invention accounts for the fact that PV module temperature influences the efficiency of the photovoltaic conversion, and therefore, the higher the module temperature, the less electrical power produced.

Hence, the proposed method manages to estimate the operating temperature of the PV module as a function of the angle of movement of the tracker, and move the PV module to positions where, considering the power also received as radiation, the module temperature is lower, such that it improves power conversion efficiency and maximizes electrical production.

Although there are no similar methods, the method of the invention represents an improvement in reliability and speed compared to methods that use power measurements to optimize the power generated. The method of the invention determines and measures environmental variables such as air temperature and does not require access to power monitoring data produced by the plant. This represents an advance with respect to methods that optimize electrical production with all the intervening variables added, because it avoids a data acquisition system with sensors in the power cables, or feedback from the monitoring system outside the control system of the solar tracker. In this way, inputs of measured variables are reduced, and reliability of the positioning method is thereby increased and can be implemented by only considering air temperature value predictions.

The immediacy of the proposed method is effective from the first day, and therefore, avoids needing a learning period by overcoming this drawback of machine learning methods. The learning period of the machine learning methods for positioning the tracker that considers air temperature as the input variable is usually quite long, since the temperature presents seasonal variation throughout the year, which, moreover, is not directly coupled with irradiation. The proposed method is adjusted prior to the start of operation of the plant and does not require this learning period. The proposed method is also immune to initial malfunctions in the production of the solar plant. It is worth mentioning that in the case of PV plants, the modules usually have an initial adjustment period in which they may suffer abnormal initial degradations, which lengthen or introduce errors in the learning period of machine learning methods. Finally, the nature of the method, and the fact of having the air temperature decoupled, avoids the erroneous movement of the tracker under anomalous conditions that have not occurred previously, such as heat or cold waves, which are increasingly frequent because of climate change.

This method makes a prediction of the temperature of the solar module based on a physical model and moves the tracker directly to an optimal position; thus being faster and more effective than the observation and disturbance methods, avoiding losses associated with the movements of disturbance to different positions that may or may not be more optimal, as well as the observation period during which it is not in the sought position.

The analysis of the actual production data and the comparison with the estimated value may also be applied in the identification of failures and malfunction of the PV generation system. In this sense, as already described, the method of the invention achieves a reduction in the temperature at which the PV modules work, to increase the power conversion efficiency of the module in operation and therefore, an increase in the electrical power produced. It is much faster and more effective than methods that optimize electrical power without particularly considering the module operating temperature, since it avoids trial and error processes to determine the optimum operating point. It also allows a precise estimation of the electrical power that a PV module must produce under real operating conditions, so that it improves a process of identifying faults and malfunctioning of the system by comparing estimated power with produced power.

In order to do so, the object of the invention estimates the positioning angle of the PV modules at which electrical power produced is deemed to be at its maximum value which depends on the input power to the panel in the form of radiation, and on the power conversion efficiency of the panel, which in turn depends on the panel operating temperature. The proposed method estimates the module's operating temperature as a function of the module's angle, air temperature, wind speed, the albedo of the soil, the type of panel and the geometric conditions of the distribution of the trackers (distance between corridors, layout, topography). For each position of the sun, the method is applied to the conditions of each solar tracker and estimates the power generated considering both the power received as a function of the angle and the operating temperature and decides which is the most optimal angle.

A complete consideration of the solar plant including the topography reaching a combination of tracker positions that yields a maximized global power generation, instead of an independent optimization of trackers. This aspect is hardly achievable by methods based on measured data or machine learning, since it would be unfeasible to consider the range of possible combinations that the application of predictive methods allows.

For this, the method of the invention implements a loss power estimation function based on the angle of inclination that balances with the temperature, obtaining an optimal angle. Additionally, a time buffer that analyzes the variability based on the wind speed to avoid continuous or alternated movements of the tracker may be implemented.

BRIEF DESCRIPTION OF FIGURES

To complement the description that is being made and to aid towards a better understanding of the characteristics of the present invention, in accordance with a preferred example of practical embodiment thereof, a set of drawings is attached as an integral part of said description wherein, with illustrative and non-limiting character, the following has been represented.

PREFERRED EMBODIMENT

Figure 1:
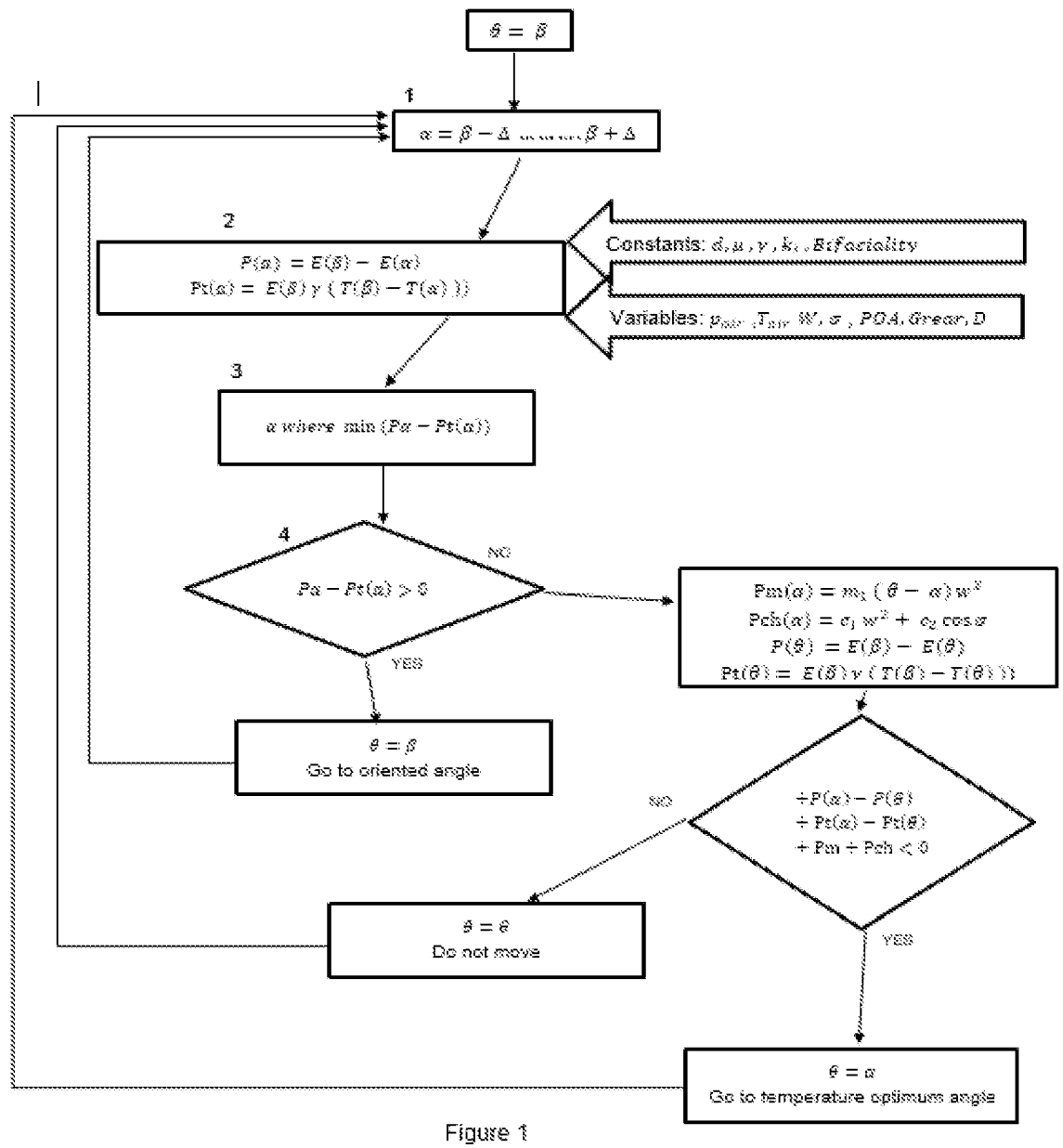
FIG. 1 shows a diagram showing the steps of the method of the invention

The advantages of the invention are better understood from FIG. 1 where the object of the invention is illustrated as a flowchart diagram.

As an added advantage of the method, it allows a precise estimation of the electrical power that a PV module must produce in real operating conditions, so that it improves a process of identifying faults and malfunctioning of the system by comparing estimated power and power produced.

Figure 2A:
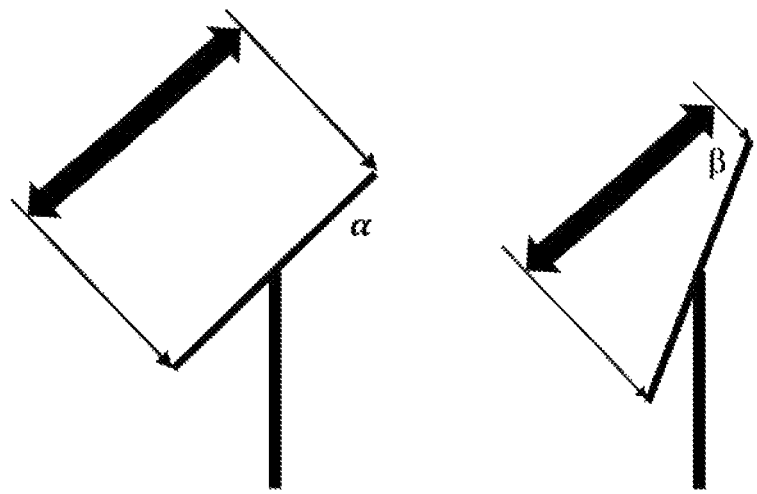
FIGS. 2a, 2b show respective diagrams where the definition of the different angles mentioned hereby angles are represented; therefore, providing an overview of a tracker orientation angle modification procedure.
Figure 2B:
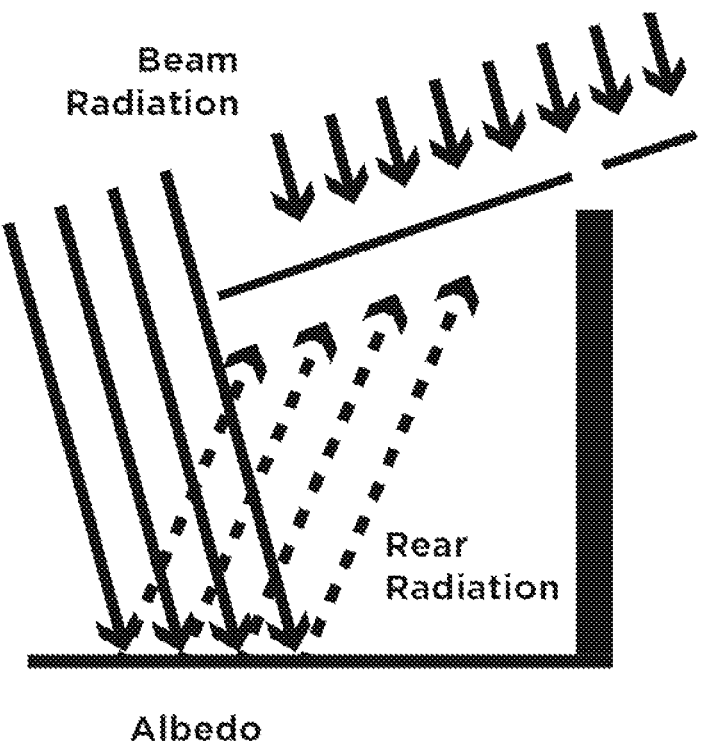

As per FIGS. 2a and 2b, the method of the invention encompasses an estimation of the module operating temperature which is made for a battery of possible tracker angles, based on a set of predetermined variables. These temperatures values are applied to the power received in the form of radiation (Eα) applying linearly the temperature coefficient at maximum power (γ) defined by the panel manufacturers, determining the Efficient power or power affected by the variation in the efficiency of conversion (Ef). Finally, the angle that maximizes this Efficient power is selected as the angle for the orientation of the tracker.

The module temperature for each angle of the tracker is calculated using a thermodynamic model of the tracker based on environmental variables to which the module is exposed, which incorporates model adjustment parameters that describe the tracker and plant geometry, thus such as the thermodynamic and power properties of the module.

The environmental input variables of the model may account as: Air temperature, wind speed W and angle of wind direction σ, beam irradiation Gbeam and position of the sun, diffuse irradiation Gdiff and the albedo of the soil Albedo. Note that beam irradiation Gbeam or Direct Normal Irradiance (DNI) is measured at the surface of the Earth at a given location with a surface element perpendicular to the Sun excluding diffuse solar irradiation (irradiation that is scattered or reflected by atmospheric components). Direct irradiance is equal to the extraterrestrial irradiance above the atmosphere minus the atmospheric losses due to absorption and scattering and losses depend on time of day (length of light's path through the atmosphere depending on the solar elevation angle), cloud cover, moisture content and other contents. The irradiance above the atmosphere also varies with time of year (because the distance to the sun varies), although this effect is generally less significant compared to the effect of losses on DNI. Diffuse irradiation Gdiff, also called sky irradiation, diffuse skylight, or just skylight, is solar irradiation reaching the Earth's surface after having been scattered from the direct solar beam by molecules or particulates in the atmosphere.

The geometric parameters of the plant and the tracker may account as: Distance between trackers or pitch, topography, tracker height, separation between panels, dimensions and gaps in the tracker structure.

The parameters derived from the properties of the module, the nominal power conversion efficiency of the module, the bifaciality (for monofacials this value is close to zero), color and characteristics of the surface, type and shape of the frame.

The method produces results based on a balance between:

Power falling upon the panel as solar irradiation (front and rear) being absorbed by the module depending on the properties of its surface. This part includes the calculation of the irradiation for the surface of each tracker considering the topography and North-South inclination of each tracker.

Power delivered in the form of electricity produced (power conversion efficiency) by both front and rear parts, namely power efficiency allowing determining a percentage of irradiation converted into electricity.

Power transferred to the air and to the rest of the bodies in the scene as heat (refrigeration) namely, an amount of heat transferred by refrigeration is estimated considering convective, conductive and radiation factors also accounting for geometric properties of the plant and the topography as well as the position of the set of trackers in the plant. The effect of positions of adjacent trackers which may influence temperature values of other related trackers may be considered as well.

The method may also incorporate a time buffer that analyzes the variability based on the historical wind speed to obtain a stable parameter thus avoiding contiguous position corrections due to gusts.

The complete simulation of the plant considering the topography allows reaching a combination of tracker positions that enables to maximize global generation, instead of independent optimization of trackers. This aspect is hardly achievable by methods based on measured data or machine learning, since it would be unfeasible to consider the range of possible combinations that the application of predictive methods permits.

The main advantage is that it optimizes the electrical production of the system for conditions of instantaneous air temperature and wind speed. It improves the electrical generation with respect to the current technique, considering incident power in the PV plane, or in some cases the output power without considering the action of changes in wind speed or air temperature.

Figure 3:
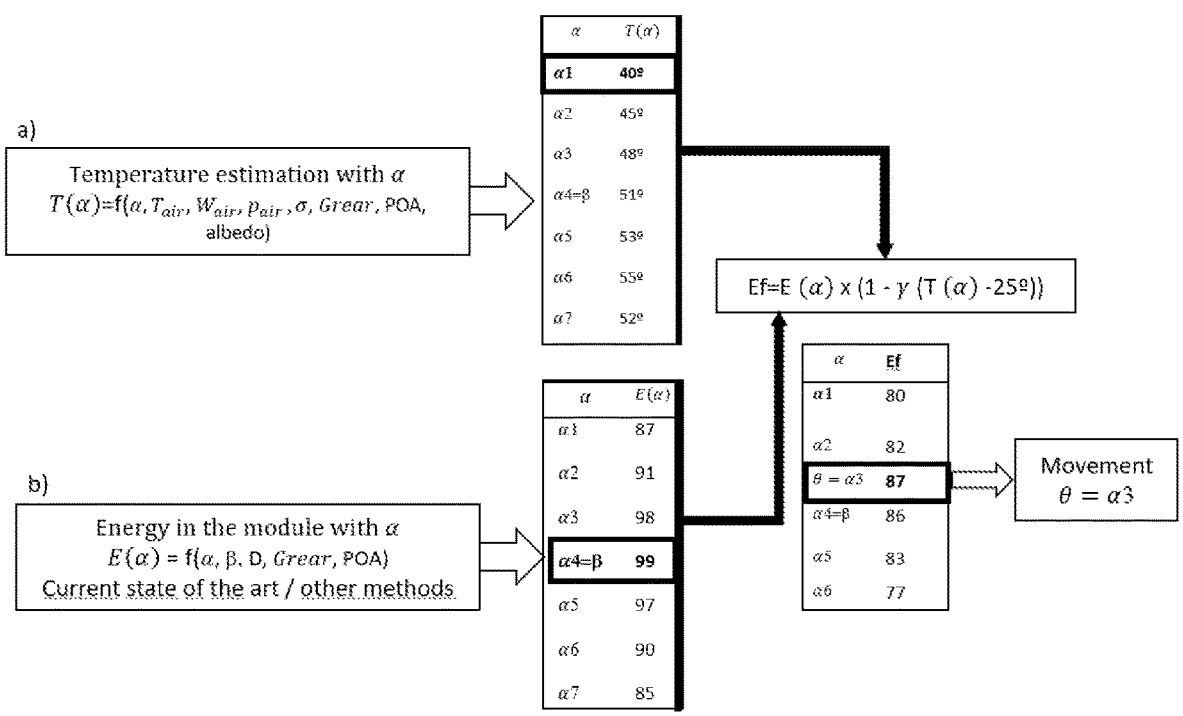
FIGS. 3a, 3b respectively depict diagrams showing a general description of the tracker orientation angle modification method assessing power losses due to misorientation for a constant temperature T=25°.

The goal of the method of the invention is based on the balance of the losses due to temperature and/or misorientation. In a preferred embodiment of the object of the invention depicted in FIGS. 3a and 3b, power due to misorientation for a constant module temperature T=25° is assessed:

$$P\alpha = E(\beta) - E(\alpha)$$

wherein:

$$E(\alpha) = \mu(Gdiff(\alpha) + Gbeam(\beta)\cos(\beta-\alpha) + bifaciality \cdot Grear(\alpha))\ E(\beta) = \mu(POA + bifaciality \cdot Grear(\beta))$$

being:

$P\alpha$=power penalty function due to misorientation
t=time and date
$E\alpha$=module electrical power estimation at a given temperature value, in this preferred embodiment T=25°
POA=Plane sun-oriented power being the power in the form of irradiation that reaches the front plane of the module.
$\alpha$=Non sun-oriented tracker angle
$\beta$=Optimal sun-oriented tracker angle
Bifaciality=module bifaciality ($0 \cong 1$)
Albedo=soil albedo
$\mu$=PV system electrical conversion efficiency
Grear=Backplane irradiation
Gbeam=Front plane beam irradiation
Gdiff=Front plane diffuse irradiation The object of the invention is preferably based on on-field measured irradiation values, said values may be collected by sensors configured to capture, among others, backplane irradiation (Grear), front plane beam irradiation or (Gbeam) or Front plane diffuse irradiation (Gdiff) values.

In some embodiments of the invention module temperature as a function of the angle $T(\alpha)$ may be assessed as:

$$T(\alpha) = (k_0 + k_1 T_{air} + + (k_2 + k_3 p_{air} T_{air} + k_4 W_{air} + \\ k_5 (\cos(\sigma) W + k_6 \cos^2(\sigma) W^2) \cdot (k_7 + k_8 d + k_9 d^2) + + \\ \sum_{i=0}^{4} k_{10+i} (albedo \cdot POA \cdot d \cdot \cos\alpha)^i + + k_{11}(1-\mu)\left(POA\left(D + 1 - \frac{(\alpha-\beta)^2}{2}\right) + \\ Grear(k_{12} - k_{13} bfacilaity)) + k_{14} T(\alpha)^{1/4}\right)$$

Being:
$p_{air}$ atmospheric pressure
$T_{air}$ Air temperature
d pitch or distance between trackers
W Wind speed
$\sigma$ angle of wind direction
$\mu$ solar module efficiency
$\theta$ angle of the solar tracker
$k_i$ adjustment parameters of the solar tracker thermodynamic model.
D=Relationship between beam and diffuse irradiation
Wherein:
$T_{air}$ is preferably measured in the field by sensors, eventually it may also be determined based on weather forecast or satellite imaging-based predictions.

Wind speed and direction are preferably measured on site by means of one or more wind vane anemometers.

In yet an alternative embodiment, another penalty function may be implemented accounting for the power effort of moving the tracker and the weight of inconvenience of investing time and how far is the extreme point of minimum, as well as an estimation of the probability that the wind changes the next minutes and the future temperature. This penalty function is used in order to decide if it is interesting to carry out the change.

$$Pm(\alpha) = m_1(\theta - \alpha) w^2$$

being:
Pch=Penalty function evaluating the power losses due to angle change.
$\alpha o$=current Tracker angle
Prt($\alpha$, $\alpha o$)=power used for rotating the tracker
Pmv($\alpha$, $\alpha o$)=power losses during the tracker movement due to pass lower irradiation points
Pwp($\alpha$, $\alpha o$)=power losses temperature in case of future wind speed with a probability value around 20%.

Being $\theta$ as the positioning angle of the tracker $\theta=\beta$, the method of the invention comprises:

Calculation of an interval of possible a in a range between −15° and +15° around the Oriented angle doing so in one-degree steps.

$$\alpha = \beta - \Delta \ldots \beta + \Delta$$

Calculation of disorientation penalty when going to an angle P ($\alpha$), as per:

$$P(\alpha)=E(\beta)-E(\alpha)$$

Calculation of the temperature gain Pt ($\alpha$), based on the updated environmental variables as per:

$$Pt(\alpha)=E(\beta)\gamma(T(\beta)-T(\alpha)))$$

Obtaining a value for angle $\alpha$ that minimizes the loss due to disorientation P$\alpha$–Pt($\alpha$).

Evaluation of the loss due to disorientation for said angle that minimizes the loss due to disorientation:

Should the value of said loss determined to be positive, the tracker is actuated to go to the oriented position, hence $\theta=\beta$.

Should the value of said loss determined to be negative, the method comprises evaluating penalty functions:

$$Pm(\alpha)=m_1(\theta-\alpha)w^2$$

$$Pch(\alpha)=c_1w^2+c_2 \cos \cos \sigma$$

$$P(\theta)=E(\beta)-E(\theta)$$

$$Pt(\theta)=E(\beta)\gamma(T(\beta)-T(\theta)))$$

Then, a calculation of penalty for movement between current position and the estimated Pm ($\alpha$), and penalty for confidence in the measure Pch ($\alpha$) disorientation between the current position and the oriented P ($\theta$) and losses due to temperature gain between the current position and the oriented Pt ($\theta$) are carried out.

Evaluation of the sum of the above terms together with the disorientation penalty P($\alpha$) and temperature gain Pt ($\alpha$) from the angle $\beta$ as per:

$$+P(\alpha)-P(\theta)+Pt(\alpha)-Pt(\theta)+Pm+Pch$$

If this resulting value is positive, the tracker is not actuated, therefore $\theta=\theta$ If this resulting value is negative, the tracker is actuated moving to the estimated position where the temperature optimum angle is achieved, therefore $\theta=\alpha$ and the method starts over again from the calculation of an interval of possible $\alpha$ in a range between $-15°$ and $+15°$ around the Optimal sun-oriented tracker angle ($\beta$) preferably doing so in one degree steps.

$$\alpha=\beta-\Delta \ldots \beta+\Delta$$

The invention claimed is:

1. Method for optimizing power production in photovoltaic modules wherein $\theta$ is an angle of the tracker, the method comprising determining a value of the following variables:
   a. air temperature ($T_{air}$),
   b. atmospheric pressure ($p_{air}$),
   c. wind speed (W),
   d. angle of wind direction ($\sigma$),
   e. plane sun-oriented power (POA) being the power in the form of irradiation that reaches the front plane of the module,
   f. backplane irradiation (Grear), and
   g. relationship (D) between Gbeam=Front plane beam irradiation, and Gdiff=Front plane diffuse irradiation,
   the method being characterized by comprising:
   i. calculation of an interval of possible values for a non sun-oriented angle ($\alpha$) comprised in a range between $-15°$ and $+15°$ around an optimal sun-oriented tracker angle ($\beta$) wherein irradiation value maximizes,
   ii. calculation of disorientation penalty when moving the tracker to an angle P ($\alpha$), as per:

$$P(\alpha)=E(\beta)-E(\alpha)$$

wherein:

$$E(\alpha)=\mu(Gdiff(\alpha)+Gbeam(\beta) \cos(\beta-\alpha)+ \text{bifaciality}\cdot Grear(\alpha)) \; E(\beta)=\mu(POA+\text{bifaciality}\cdot Grear(\beta))$$

P$\alpha$=power penalty function due to misorientation,
   E$\alpha$=module electrical power estimation at a given temperature value T,
   POA=plane sun-oriented power being the power in the form of irradiation that reaches the front plane of the module,
   $\alpha$=non sun-oriented tracker angle,
   $\beta$=optimal sun-oriented tracker angle, assessed using any of method from the state of the art, in a preferred embodiment of the invention astronomic tracking techniques were used,
   Bifaciality=module bifaciality
   $\mu$=PV system electrical conversion efficiency,
   Grear=backplane irradiation,
   Gbeam=Front plane beam irradiation, and
   Gdiff=Front plane diffuse irradiation
      calculation of the temperature gain Pt ($\alpha$), based on updated environmental variables selected from the group consisting of: Air temperature ($T_{air}$), wind speed (W) and angle of wind direction ($\sigma$), beam irradiation and position of the sun, diffuse irradiation and albedo of the soil; as per:

$$Pt(\alpha)=E(\beta)\gamma(T(\beta)-T(\alpha)))$$

wherein:

$$T(\alpha) = (k_0 + k_1 T_{air} + +(k_2 + k_3 p_{air} T_{air} + k_4 W_{air} + k_5(\cos(\sigma)W + k_6\cos^2(\sigma)W^2) \cdot (k_7 + k_8 d + k_9 d^2) + + \sum_{k=0}^{4} k_{10+i}(albedo \cdot POA \cdot d \cdot \cos\alpha)i + +k_{11}(1-\mu)\left(POA\left(D+1-\frac{(\alpha-\beta)^2}{2}\right)+Grear(k_{12}-k_{13}bifaciality))+k_{14}T(\alpha)^{1/4}\right)$$

being:
   $p_{air}$ atmospheric pressure
   $T_{air}$ Air temperature
   d pitch or distance between trackers
   W Wind speed
   $\sigma$ angle of wind direction
   $\mu$ solar module efficiency
   $\theta$ tracker angle
   $k_i$ adjustment parameters of the tracker thermodynamic model
   iii. obtaining a value for the non sun-oriented angle ($\alpha$) that minimizes losses due to disorientation P$\alpha$–Pt ($\alpha$),
   iv. evaluation of the loss due to disorientation for said non sun-oriented angle ($\alpha$) that minimizes losses due to disorientation P$\alpha$–Pt ($\alpha$) in such a way that:
      a. should the value losses due to disorientation P$\alpha$–Pt ($\alpha$) determined to be positive, the tracker is actuated to go to the oriented position related to an angle wherein front plane irradiation level Gbeam is maximum, hence $\theta=\beta$
      b. should the value of said losses due to disorientation P$\alpha$–Pt ($\alpha$) determined to be negative, the method comprises evaluating:

penalty for movement $Pm(\alpha)$ between current position and the estimated position following:

$Pm(\alpha)=m_1(\theta-\alpha)w^2$, being $m_1$ a parameter of the thermodynamic model,
penalty for confidence in measurements $Pch(\alpha)$ following:

$Pch(\alpha)=c_1 w^2+c_2 \cos\cos\sigma$ being $c_1$, $c_2$ parameters of the CFD model,
disorientation penalty $P(\theta)$ between a current position and an oriented position following:

$P(\theta)=E(\beta)-E(\theta)$ temperature gain $Pt(\theta)$ between the current position and the oriented position:

$Pt(\theta)=E(\beta)\gamma(T(\beta)-T(\theta)))$ c. evaluation of the losses together with the disorientation penalty $P(\alpha)$ and temperature gain $Pt(\alpha)$ from the optimal sun-oriented tracker angle ($\beta$) as per:

$+P(\alpha)-P(\theta)+Pt(\alpha)-Pt(\theta)+Pm(\alpha)+Pch(\alpha)$ in such a way that:
resulting value being positive, the tracker is not actuated, therefore $\theta=\theta$, and
resulting value being negative, the tracker is actuated moving to the estimated position where a maximum energy production level considering temperature optimum angle is achieved, therefore $\theta=\alpha$; and
the method comprises starting over again from step i.

2. The method of claim 1 wherein the air temperature ($T_{air}$) is determined by means of sensors associated to the panel.

3. The method of claim 1 wherein the wind speed (W) is determined by means of sensors associated to the panel.

4. The method of claim 1 wherein the angle of wind direction ($\sigma$) is determined by means of sensors associated to the panel.

5. The method of claim 1 wherein at least one irradiation value selected from the group consisting of: backplane irradiation (Grear), front plane beam irradiation or (Gbeam) or Front plane diffuse irradiation (Gdiff), is picked up by on-field sensors.

* * * * *